(12) United States Patent
Nguyen et al.

(10) Patent No.: US 7,209,533 B1
(45) Date of Patent: Apr. 24, 2007

(54) DELAY LOCKED LOOP WITH HARMONIC LOCK AND HANG PREVENTION ARCHITECTURE

(75) Inventors: Hai Nguyen, Sunnyvale, CA (US); Yu-Sheng (Stephen) Yang, Cupertino, CA (US); Vuong Le, Milpitas, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 722 days.

(21) Appl. No.: 10/437,874

(22) Filed: May 13, 2003

(51) Int. Cl.
*H03D 3/24* (2006.01)
(52) U.S. Cl. .................................................. 375/376
(58) Field of Classification Search ................ 375/376, 375/294, 327, 375, 372; 329/325, 360; 327/147, 327/156
See application file for complete search history.

(56) References Cited

U.S. PATENT DOCUMENTS

| | | | | |
|---|---|---|---|---|
| 5,179,303 | A * | 1/1993 | Searles et al. | 327/277 |
| 5,337,022 | A * | 8/1994 | Pritchett | 331/1 A |
| 6,667,643 | B2 * | 12/2003 | Ko | 327/158 |
| 7,038,971 | B2 * | 5/2006 | Chung | 365/233 |

\* cited by examiner

*Primary Examiner*—Khai Tran
(74) *Attorney, Agent, or Firm*—Merchant & Gould P.C.; Timothy P. Sullivan

(57) ABSTRACT

The present invention prevents the DLL from locking into the wrong phase, harmonic lock and hang. The detection is independent of temperature, voltage and process that the DLL is running. Including these mechanisms in the DLL design, the operating frequency range of the DLL can be extended significantly. Also many design blocks in the main loop can be reused for these additional circuitries, the design time of this DLL is much faster than to design a whole new hang or harmonic lock prevention circuitries.

16 Claims, 7 Drawing Sheets

DELAY LOCKED LOOP WITH HARMONIC LOCK AND HANG PREVENTION ARCHITECTURE

FIELD OF THE INVENTION

The present invention relates to electronic circuits, and more specifically to architectures for Delay Locked Loops.

BACKGROUND OF THE INVENTION

Delay Locked Loop (DLL) architectures are used in many applications to synchronize system clocks and to generate precise strobes in order to meet the stringent set up time and hold time requirement of the high speed system. Many DLL operating frequency ranges, however, are limited. One problem is that the loop may lock into a wrong phase.

Over different temperatures, voltages and processes variations, the operating range is hard to precisely control. What is needed is a way to prevent the DLL from locking into a wrong phase and is independent of process, temperature and voltage variation.

DETAILED DESCRIPTION OF THE PREFERRED EMBODIMENT

Figure 1:
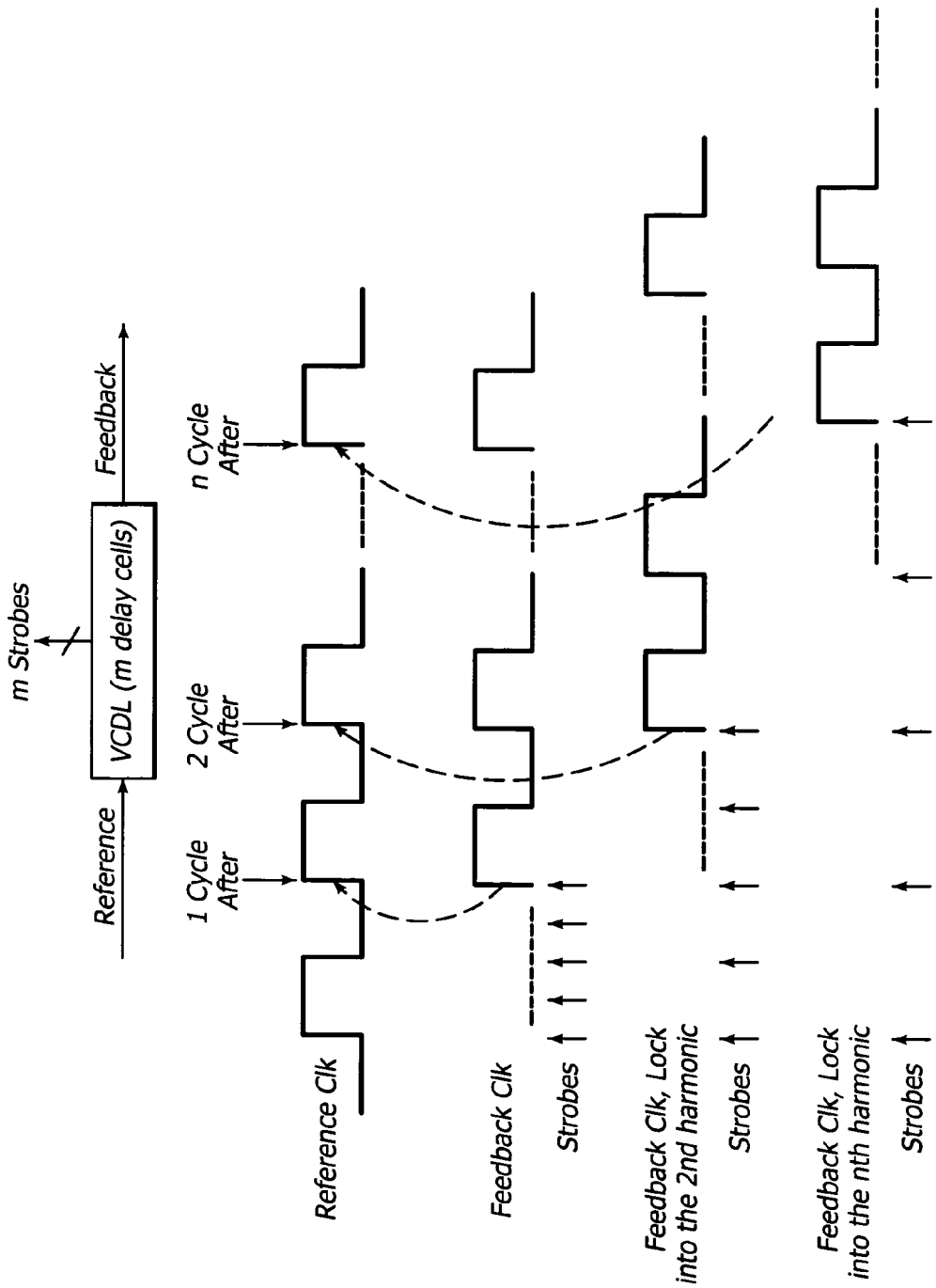
FIG. 1 illustrates a graph of feedback clocks locking into different harmonics of a reference.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

The terms "comprising," "including," "containing," "having," and "characterized by," mean an open-ended or inclusive transitional construct and does not exclude additional, unrecited elements, or method steps. For example, a combination that comprises A and B elements, also reads on a combination of A, B, and C elements.

The present invention is directed at preventing a DLL from locking into the wrong phase, preventing harmonic lock and preventing hang. The detection is independent of temperature, voltage and process that the DLL is running. Including these mechanisms in the DLL design, the operating frequency range of the DLL can be extended significantly. Also many design blocks in the main loop can be reused for these additional circuitries. The design time of the DLL is much faster than having to design whole new hang or harmonic lock prevention circuitries.

FIG. 1 illustrates a graph of feedback clocks locking into different harmonics of a reference. In many DLL applications, especially using a DLL to generate evenly distributed strobes, the propagation delay of the VCDL should be exactly one reference clock period, which means the feedback clock should lock into the reference clock after one cycle delay. However, since the feedback clock doesn't know the correct reference clock phase to lock into, the feedback clock may try to lock into the 2nd, 3rd or even higher harmonic of the correct reference clock phase. Since the main loop filter voltage range limits the DLL operating frequency range, the feedback and reference clocks may never lock. The delay difference between each strobe will be wrong as well, resulting in harmonic lock.

For example, if there are M delay cells in a voltage controlled delay line (VCDL) and the reference clock period is K seconds then the delay between each strobe is K/M seconds when the feedback is locked at the correct reference clock phase. If the feedback clock locks into the second harmonic of the reference clock the delay between each strobe is doubled, which is ((2*K)/M) seconds. Therefore, if the feedback clock locks into the Nth harmonic of the reference clock the delay between each strobe is ((N*K)/M) seconds. In applications, these strobes can not sample out correct data.

Figure 2:
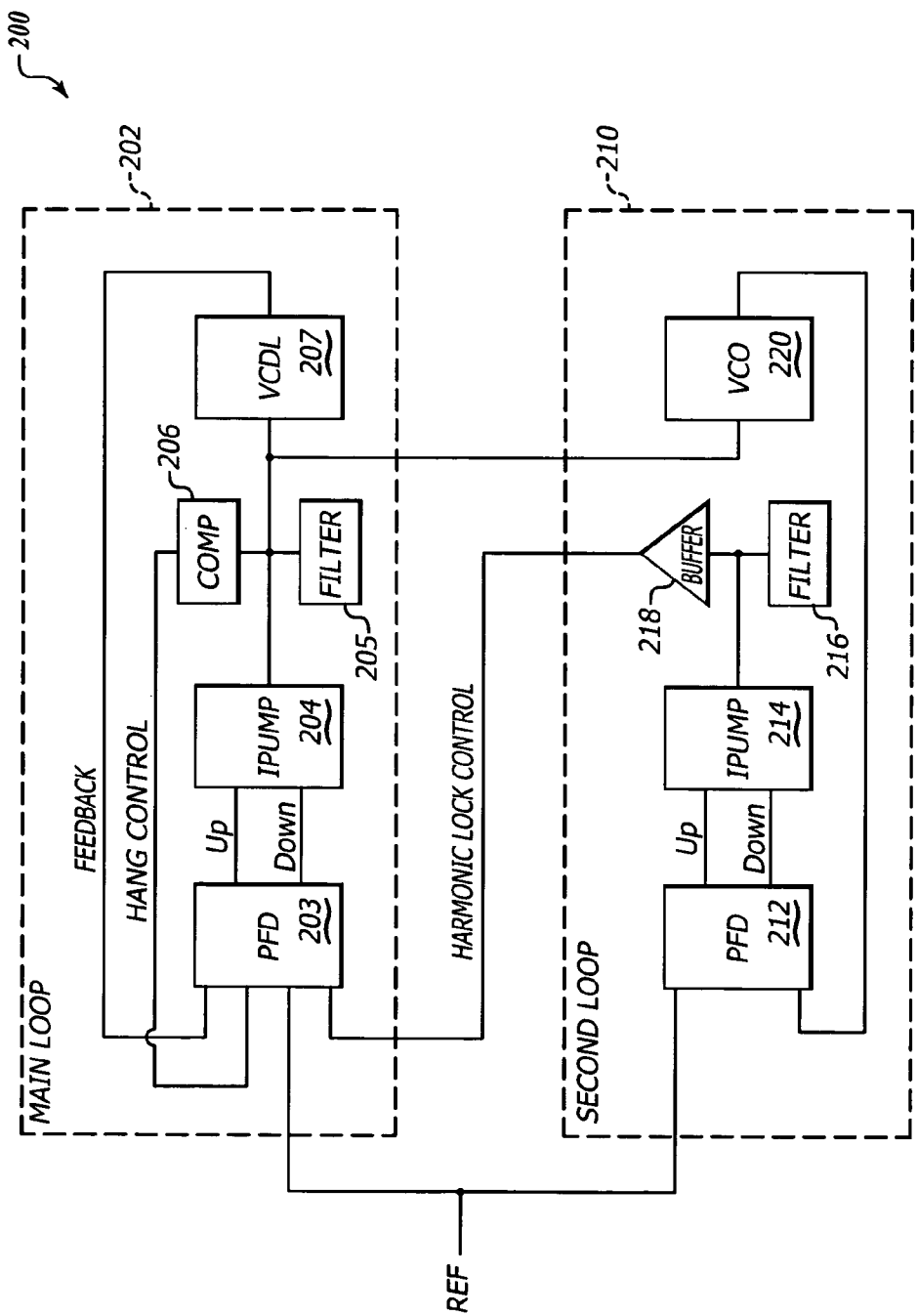
FIG. 2 shows a block diagram of a DLL architecture for preventing harmonic lock as well as preventing a hang problem.

FIG. 2 shows a block diagram of a DLL architecture for preventing loop lock into the harmonic phase as well as preventing a hang problem, in accordance with aspects of the invention. As illustrated in the figure, DLL architecture 200 includes a main loop and a second loop. Main loop 202 includes a phase frequency detector (PFD 203), a charge pump (IPUMP 204), a filter (FILTER 205), a comparator (COMP 206), and a voltage controlled delay line (VCDL 207). Second Loop 210 includes PFD 212, IPUMP 214, filter 216, buffer 218 and voltage controlled oscillator (VCO 220).

DLL architecture 200 is directed at detecting a false lock even when the temperature, voltage and process are varied. Also, the blocks in the architecture can be reused which can speed up the DLL design. Second loop 210 is used to prevent the main loop from harmonic lock problem state. Generally, the second loop works like a switch. When main loop 202 tends toward a harmonic lock problem state, second loop 210 sends a signal (Harmonic Lock Control flag) that forces main loop 202 to make the delay between each delay cell in VCDL 207 smaller. As a result of making the delay smaller, the feedback clock comes back and locks into the correct reference clock.

VCO 220 runs at a higher speed than reference clock when the DLL locks into the correct reference clock phase. In this case, the second loop charge pump (IPUMP 214) keeps charging (or discharging) the second loop filter (216). The filter voltage then becomes higher (or lower) than the threshold of the second loop buffer, and the buffer outputs a logic high (or low) (the Harmonic Lock Control signal) to signal the main loop that the DLL does not have a harmonic lock problem. The harmonic lock control signal is used to control the main loop PFD (203) and make the main loop maintain normal operation.

Assuming the feedback clock locks into a wrong phase, n cycles after the correct phase, the main loop filter voltage (205) causes the VCO (220) output frequency to be lower than reference clock. The second loop filter (216) voltage moves lower (or higher) than the threshold voltage of buffer 218, and buffer 218 outputs a logic signal representing that the DLL tends to be in a harmonic lock state. In other words, during normal operation the signal is one logic state and during a harmonic lock state the logic signal is the complementary signal.

Suppose the delay of each delay cell in the VCDL is proportional to the filter voltage. The higher the filter voltage, the longer the delay cell delay. Therefore, if the input reference frequency is higher, the main loop filter (205) voltage needs to go lower in order to reduce the delay of each delay cell.

According to one embodiment of the invention, VCO 220 frequency is set to run at about 1.4 times of the reference clock frequency when the feedback is locked to the correct reference clock phase. The 1.4 times frequency was chosen to detect the harmonic lock before it happens but as far away from the normal operation so that the noise will not trigger a false alarm. Other frequencies may be chosen.

Now assume VCO 220's output frequency of the second loop is reversely proportional to the main loop filter 205 voltage. When the main loop is locked at the correct reference clock phase, the VCO output clock is 1.4 times faster than the reference clock. Charge pump 214 in the second loop keeps charging second loop filter 216. Once the filter voltage of filter 216 is higher than the threshold voltage of buffer 218 in the second loop, buffer 218 outputs a logic high signal indicating the main loop is in normal operation. No adjustment for the main loop is needed under this condition If the feedback clock incorrectly locks into another harmonic of the reference clock, the delay of each delay cell in VCDL is longer indicating that the main loop filter voltage is higher than desired. The higher main loop filter voltage causes the second loop VCO output frequency to become slower. When the VCO output is slower than the reference clock, charge pump 214 starts to discharge second loop filter 216. Until the voltage of filter 216 goes lower than the threshold voltage of second loop buffer 218, the output of buffer 218 becomes a logic low providing the main loop a flag that the DLL about to go into a harmonic lock state.

Now assume the feedback is locked into the second harmonic of the reference clock, the delay of each delay cell is two times longer than if it locked into the correct phase of the reference clock. In this case, the main loop filter voltage is higher compared to the main loop filter voltage when it locked into the right phase. Since the delay cell in the VCO is the same as the delay cell in the VCDL, the delay of each delay cell in the VCO will also doubled. This means that the VCO output frequency is half compared to when the loop locks into the correct reference clock phase. If the VCO is 1.4 times of the reference clock as the feedback locked into correct reference clock phase, then, when the feedback clock locks into the second harmonic of the reference clock, the VCO output frequency is 0.7 times of the reference clock. As soon as the VCO frequency is lower than the reference clock frequency, the second loop's charge pump starts to discharge the second loop filter until the filter voltage is lower than the threshold of the second loop buffer and the output of the buffer becomes low. The output of the buffer acts as a flag to the main loop warning that the DLL tends to be in a harmonic lock state.

Figure 3:
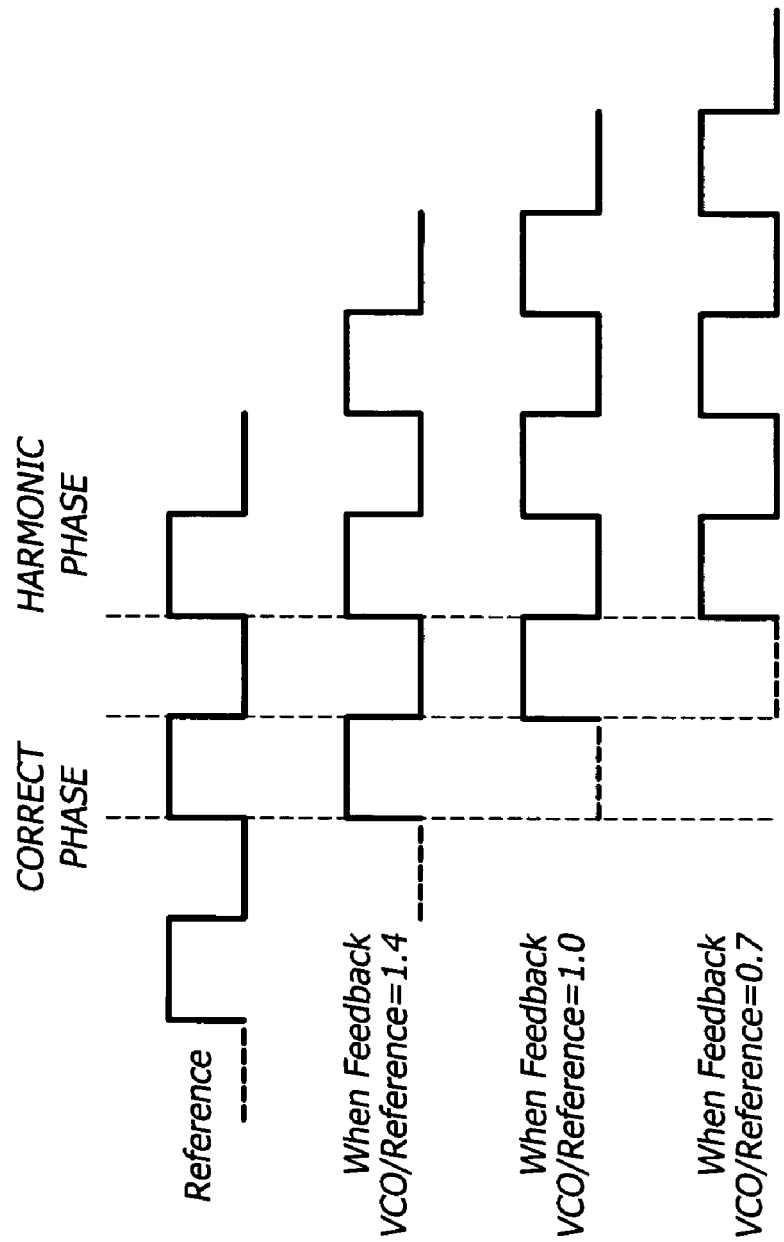
FIG. 3 illustrates a graph showing various feedback VCOs compared to the reference signal.

FIG. 3 illustrates a graph showing various feedback VCOs compared to the reference signal. If the feedback is locked at correct reference clock phase, the VCO output frequency is 1.4 times of the reference clock frequency. If the feedback is locked into the 2nd harmonic of the reference clock the VCO output is 0.7 times of the reference clock frequency. So when the VCO output frequency is the same as the reference clock frequency, VCO/Reference=1, the feedback clock is at the half way point between the harmonic locked and correct locked. According to one embodiment, this point is a good point to detect harmonic lock. It is far away from a correct lock and early enough to indicate harmonic locked may happen. After the feedback falls at this point, if the delay of each delay cell in VCDL is getting smaller, then the main loop filter voltage will start to go lower. The lowering of the main loop filter voltage causes VCO to go faster as well. The second loop filter starts to charge up, and since the buffer at the second loop is sending out a high signal, the main loop stays in normal operation and no adjustment is required. If from the point that the VCO frequency equals to the reference frequency, the delay of each delay cell in the VCDL is getting longer and longer, the main loop filter voltage will go higher causing the VCO to run slower than the reference clock. Therefore the second loop filter is discharged. Until the second loop filter voltage goes lower than the threshold voltage of the second loop buffer, the second loop sends a flag to the main loop and the main loop does some adjustment to prevent the DLL from entering a harmonic lock.

When the main loop receives a flag indicating that the loop is about to be harmonic locked, it will turn off the phase frequency detector Up (or Down) pulse to force the loop to go the other direction.

Figure 4:
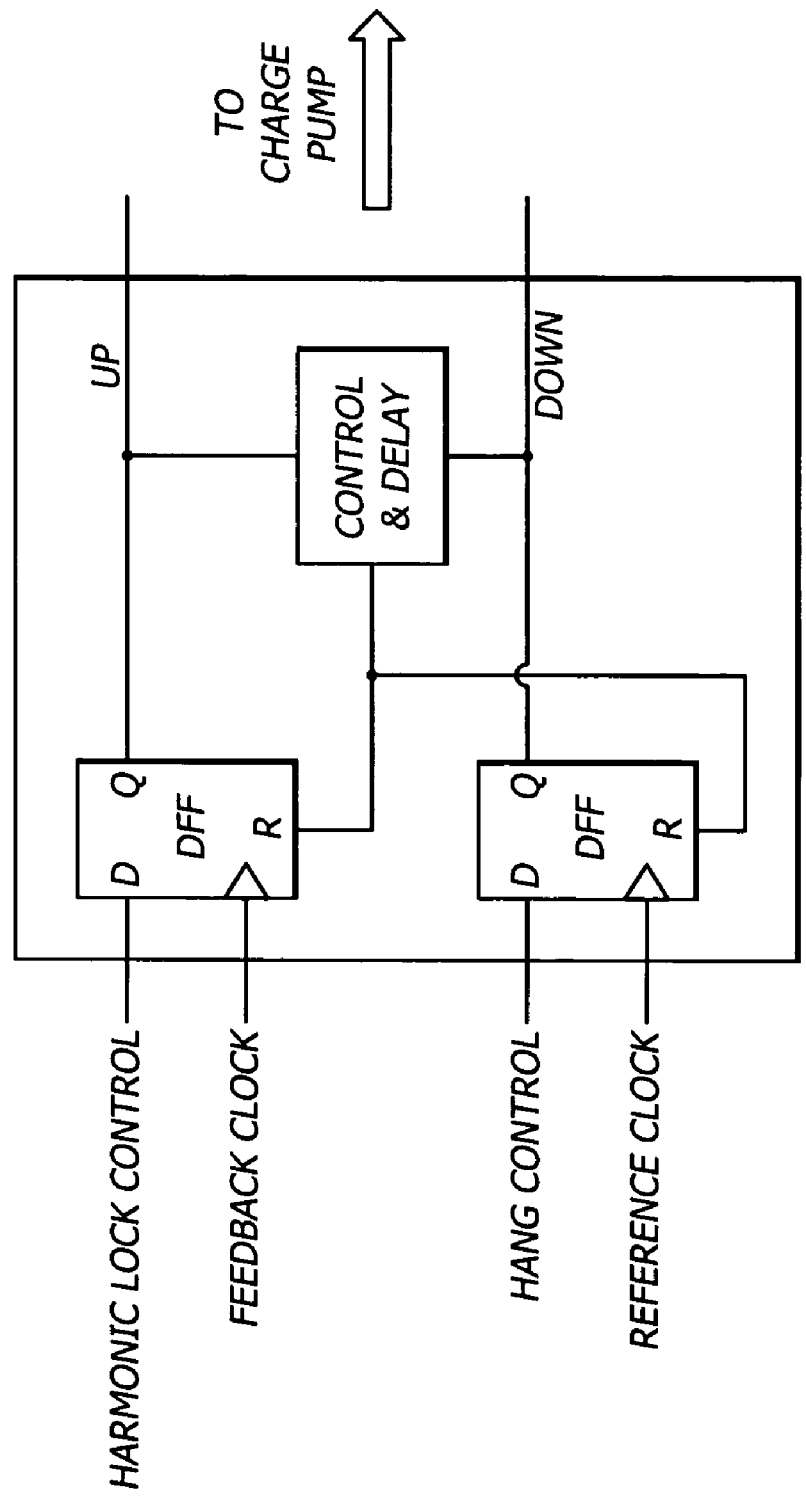
FIG. 4 is a block diagram of an exemplary phase frequency detector.

FIG. 4 is a block diagram of an exemplary phase frequency detector (PFD) in accordance with aspects of the invention. As illustrated in the figure, the harmonic lock control line is coupled to the second loop buffer output. The hang control line is coupled to VCC.

When the harmonic lock control line is low the Up pulse for the main loop is turned off, the Up output in the main loop stays low. If the harmonic lock control is high, the Up output of the main loop switches as normal. Therefore, during normal operation (not in a harmonic lock problem state), if the feedback is faster than the reference, the Up signal has bigger pulses, and the charge pump will pump more current to the filter, consequently slowing down the feedback clock. If the reference is faster than the feedback, the Down signal has bigger pulses than the Up, and the charge pump discharges the main loop filter. The filter voltage goes lower and the delay in each delay cell of the VCDL is smaller.

Once the main loop receives a harmonic lock flag, the harmonic lock control becomes low, and then the Up signal of the phase frequency detector output stays low as well.

Figure 5:
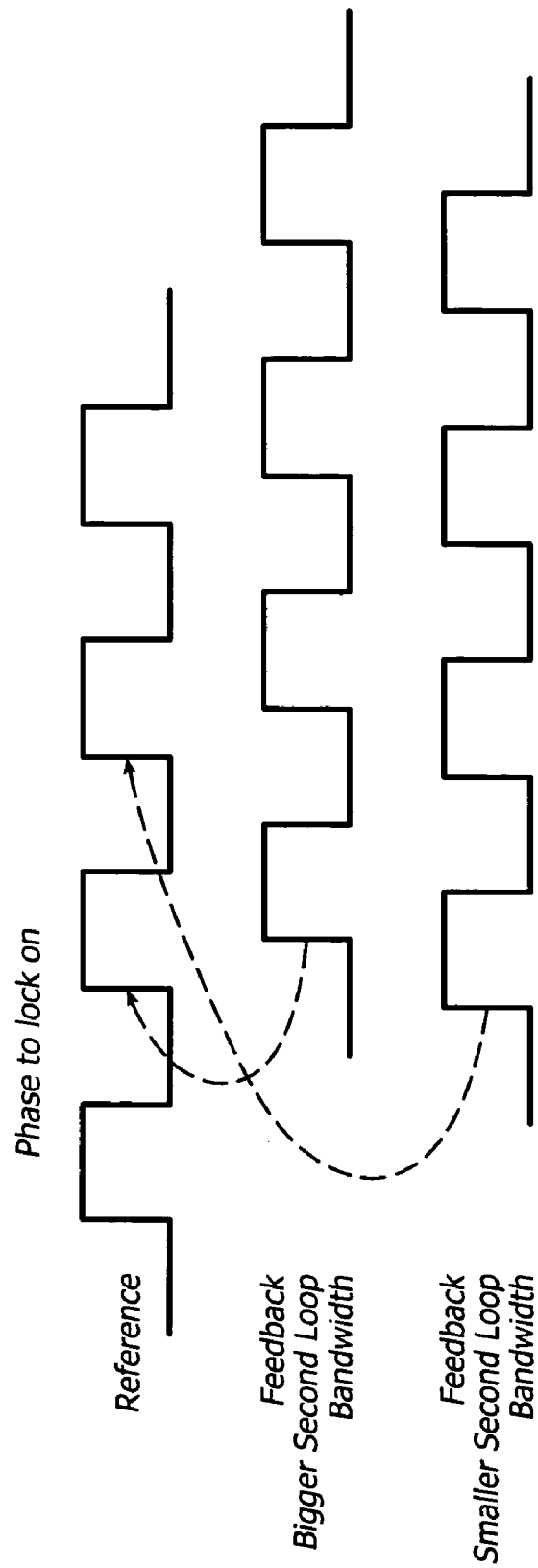
FIG. 5 is a graph illustrating second loop bandwidths as compared to the main loop, and an exemplary reference clock.

During this period, the main loop filter voltage will go lower since the Up signal of the phase detector output always low (which means the delay of each delay cell in the VCDL will be getting smaller as the filter voltage goes lower). The feedback signal then starts to catch up with the reference clock. Once the phases of feedback and reference are close enough as determined by the design, the VCO is again running faster than the reference clock frequency and the harmonic lock flag is removed. The harmonic lock control becomes high; the main loop comes back to normal operation FIG. 5 is a graph illustrating second loop bandwidths as compared to the main loop, and an exemplary reference clock. Once the second loop notices that a harmonic lock is about to happen, the main loop starts to reduce the delay between each delay cell until the phase of correct reference clock and the phase of feedback clock are close to each other.

If the second loop has a larger bandwidth than the main loop (202) then when the filter voltage is changed in the main loop the second loop filter voltage (which is used to indicate the harmonic lock state) responds faster than the main loop. Therefore, once the phase of the feedback clock and correct reference clock are close enough, the second loop releases the harmonic lock flag to return the main loop back to normal operation. The feedback clock is locked into the correct reference clock phase at this point.

From the phase frequency detector point of view, when the second loop turns off the harmonic lock problem state, the feedback clock is still running slower than the reference clock. As a result, the reference clock comes in earlier than the feedback clock in the next cycle after the harmonic locked warning is turned off. In response, the Down signal has a bigger pulse forcing the feedback clock to catch up with the correct reference clock phase returning the main loop to a correctly locked state.

If the bandwidth of second loop were too small, the second loop filter voltage would not change as fast as the main loop. Therefore, when the phase of reference clock and feedback are close enough, the second loop filter may still be too low (or high) so the harmonic lock state detection remains low, and the main loop is still pushed to run faster. There is a chance that the feedback clock phase may have already passed the correct reference clock phase but still be very close to the correct reference clock phase until the second loop filter voltage is high enough. In this case, the phase detector may miss one reference clock rising edge (since it overlaps with the reset pulse). As a result, a feedback clock comes in first to toggle the Up signal. Then the main loop will go slower again since the Up pulse is bigger than the Down pulse. Eventually the system will be harmonic locked again and be unstable.

The bandwidth of the second loop, therefore, is designed to have a larger bandwidth than the main loop in order not become unstable. Another benefit of this design is that all the blocks in the main loop can be reused in the second loop. This can save a lot of design time to design another scheme to prevent harmonic lock.

According to one embodiment of the invention, the second loop may be turned off after the DLL is correctly locked. This lessens the noise of the system and consumes less current. When the reference clock is not always stable and clean it may be desirous to leave the second loop operating. Since the VCO and some other circuits are turned off, this will improve the noise and power performance of the system.

Figure 6:
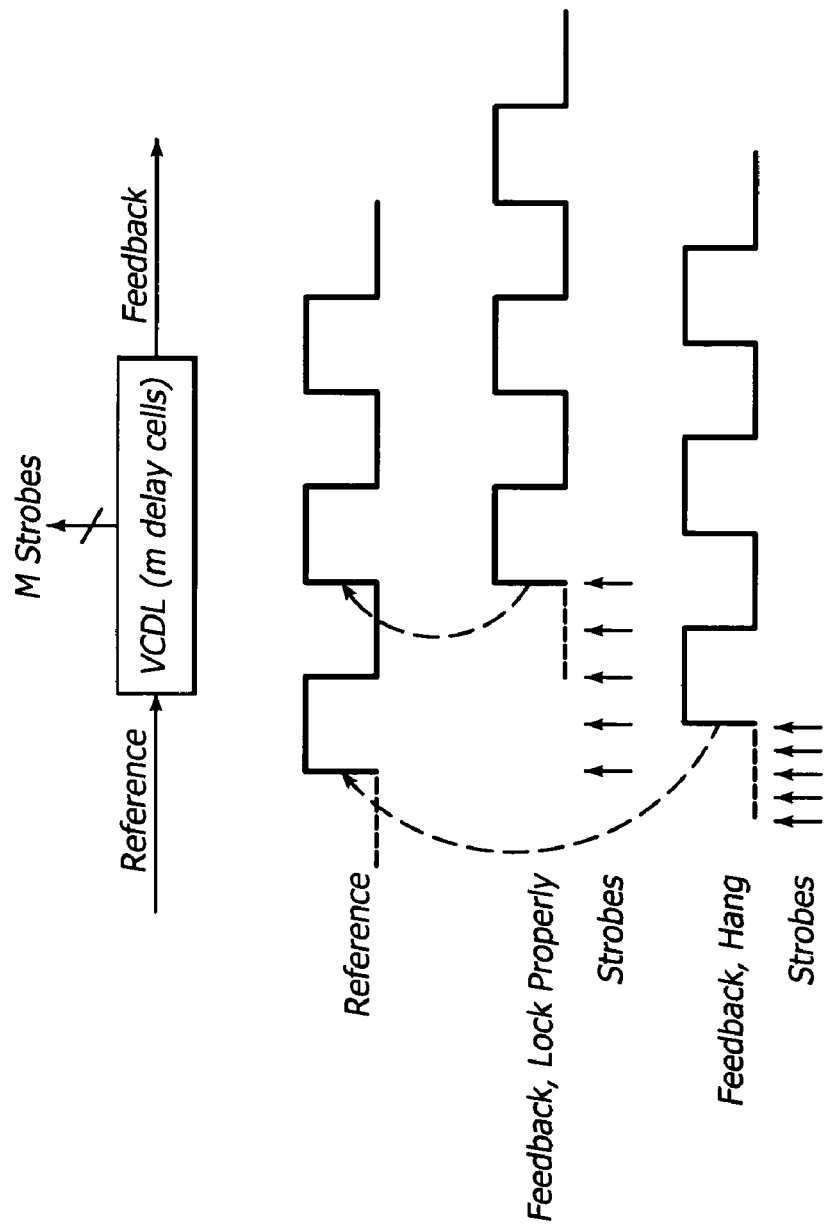
FIG. 6 illustrates feedback hang.

FIG. 6 illustrates feedback hang. As illustrated, the figure includes a VCDL, a reference clock, a feedback signal locked properly, and a feedback that has a hang problem.

In a hang problem, opposite to harmonic lock, the feedback clock may try to catch up to the reference clock edge one cycle too early. The feedback clock of the DLL is a delayed version of an input clock. When the DLL is locked; the feedback clock should lock into a cycle after the first cycle of the input reference clock. The phase detector, however, doesn't know which is the correct phase to compare. When the feedback tries to catch the reference clock of one cycle too early, the loop keeps forcing the VCDL to run faster. Once the filter voltage reaches its limit, the VCDL cannot go faster even though the loop still asks the loop to run faster. As a result, the VCDL stops at its limit, leaving the reference and feedback clock having a static phase error. This results in the DLL never locked.

Figure 7:
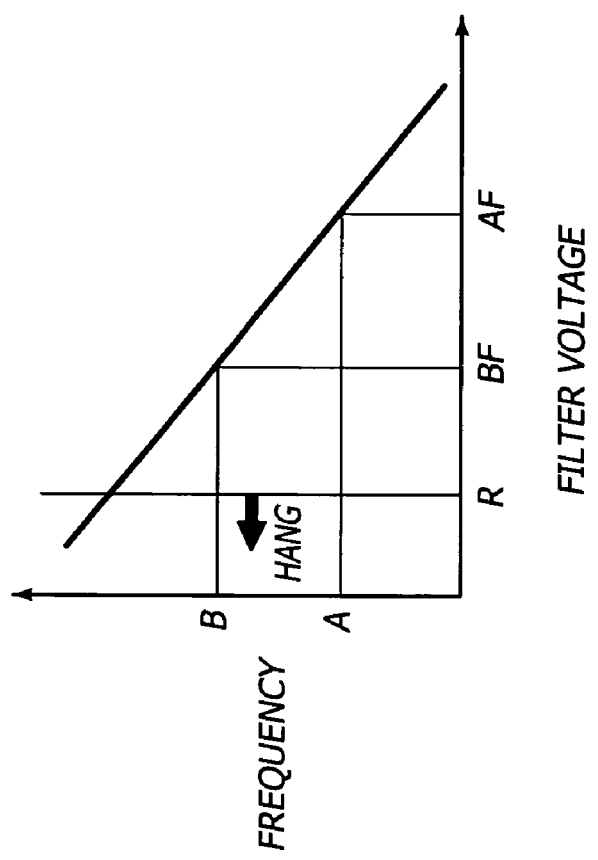
FIG. 7 shows a graph of filter voltage x frequency used to indicate a hang problem, in accordance with aspects of the invention.

FIG. 7 shows a graph of filter voltage x frequency used to indicate a hang problem, in accordance with aspects of the invention. When the DLL has a hang problem, the filter voltage is either close at the very high end or close to the very low end, depending on the design of the DLL. (FIG. 7 shows the filter voltage close to the low end when the DLL is in hang.)

The filter voltage can be used as an indicator to know when the DLL has a hang problem. If the filter voltage is close to VCC or ground, the DLL is running close to its limit, which is an indication that the loop may have a hang problem.

An example will now be provided to further clarify the mechanism to prevent hang. Assume the filter voltage goes lower if the delay of each delay cell in the VCDL is smaller and the design required frequency to operate from A MHz to B MHz (A<B) and the filter voltage is AF voltage when it operate at A MHz and BF voltage when it operates at B MHz, where BF<AF. Therefore, if the filter goes much lower than the BF voltage, the VCDL is running at very small delay (very high frequency), and there is a potential that a hang problem may occur. At this point a hang problem signal may be provided to the main loop illustrated in FIG. 2.

A comparator is introduced to detect the filter voltage. The comparator compares the filter voltage with a reference voltage R. If the filter voltage goes beyond R volt, the hang flag will be high. The hang flag then causes the PFD to turn off the Up or Down pulse (base on the design) forcing the main loop to go the direction that makes the VCDL run slower until the filter voltage comes back and close to the target operating range.

When the loop is in normal operation, both the hang control signal and harmonic lock control are high, according to one embodiment of the invention. The Up and Down outputs are functioning normally. Once the loop receives a hang problem signal, the hang control becomes low so the Down output stays low. This results in the charge pump only receiving an Up signal. The Up signal keeps charging the main loop filter causing the filter voltage to keep going higher. Once the filter voltage goes higher, the delay of each delay cell in the VCDL becomes larger so that the VCDL output frequency becomes slower thereby causing the loop to go out of the hang problem.

Again assume that the DLL will run faster if the filter voltage is lower. Once the hang flag is turned on, the PFD Down pulse is blocked. Since there is no reset pulse in the PFD when the Down signal is low, the Up pulse stays high, and the filter voltage keeps going higher. Until the filter voltage goes higher than R voltage (as illustrated in FIG. 7) the hang problem signal is turned off, the Down pulse from PFD is toggled again. Once the Down pulse switching, it will reset the Up pulse then the PFD waiting for next feedback or reference clock to determine which direction to go.

According to one embodiment, voltage R is set to be far away from BF. In other words, when the hang flag is off, the feedback clock still runs faster than the reference clock. In this case, right after the hang flag goes off and the Down pulse is reset, the next clock coming to the PFD in the main loop will be feedback. So the Up pulse is high and waits for the reference clock to trigger the Down pulse to reset the PFD. The filter voltage becomes higher to bring the VCDL frequency down to the target operating frequency range again.

If the hang detect filter voltage R is set too close to voltage BF, when the filter voltage goes higher than R voltage, the feedback clock maybe running slower than the reference clock. This may result since the comparator has some hysteresis before the hang flag can go away. So the reference clock triggers the Down signal before the feedback clock triggers the Up signal. Then the filter voltage then starts to go lower again. Instead of make the VCDL goes slower, the loop makes the VCDL run faster causing it to hang again. The loop will keep repeating between hang and not hang, which cause the loop is unstable.

In order to prevent this unstable problem from occurring, the filter voltage R is not set too close to the voltage BF (the voltage that the loop will running at its highest target frequency).

The above specification, examples and data provide a complete description of the manufacture and use of the composition of the invention. Since many embodiments of the invention can be made without departing from the spirit and scope of the invention, the invention resides in the claims hereinafter appended.

We claim:

1. An apparatus for preventing a DLL from locking into the harmonic phase and preventing a hang problem that is independent of temperature, voltage and process, comprising:
   a main loop including
      a first phase frequency detector (first PFD) coupled to a reference signal;
      a first charge pump coupled to the first PFD and coupled to a first node;
      a first filter coupled to the first node;
      a comparator having an input coupled to the first node and an output coupled to the first PFD;
      a voltage controlled delay line (VCDL) having an input coupled to the first node and an output coupled to the first PFD;
   a second loop, including
      a second phase frequency detector (second PFD) coupled to the reference signal;
      a second charge pump coupled to the second PFD and coupled to a second node;
      a second filter coupled to the second node;
      a buffer having an input coupled to the second node and an output coupled to the first PFD; and
      a voltage controlled oscillator (VCO) coupled to the first node, coupled to the second PFD.

2. The apparatus of claim 1, wherein the VCO is configured to run faster than a reference clock when the DLL is locked into a correct phase.

3. The apparatus of claim 2, wherein the VCO is configured to run about 1.4 times faster than the reference clock.

4. The apparatus of claim 1, wherein a main loop filter voltage is used to adjust an output frequency of the VCO.

5. The apparatus of claim 4, wherein the main loop filter voltage is used to determine when the feedback clock is in a harmonic lock problem state.

6. The apparatus of claim 3, wherein the buffer is configured to output a signal indicating the DLL is in a harmonic lock problem state.

7. The apparatus of claim 1, wherein the first charge pump and the second charge pump are interchangeable.

8. The apparatus of claim 1, wherein the first PFD and the second PFD are interchangeable.

9. The apparatus of claim 1, wherein the first filter and the second filter are interchangeable.

10. The apparatus of claim 5, wherein a filter voltage associated with the first filter is used to determine when a hang problem exists.

11. The apparatus of claim 10, wherein the comparator is further configured to compare the filter voltage to a reference voltage.

12. A method for preventing a DLL from locking into the wrong phase and preventing a hang problem that is independent of temperature, voltage and process, comprising:
   detecting when a main loop is in a harmonic lock problem state using a second loop;
   sending a signal to the main loop indicating that it is the harmonic lock problem state;
   adjusting a delay between each delay cell such that the main loop exits the harmonic lock problem state; and
   determining a hang problem by determining a filter voltage; comparing the filter voltage to a reference voltage; and providing the main loon with a hang control signal based on the comparison; wherein the hang control signal is used for adjusting a first PFD an pulse forcing the main loop to go the direction that makes a VCDL run slower until the filter voltage comes within a target operating range.

13. A method for preventing a DLL from locking into the wrong phase and preventing a hang problem that is independent of temperature, voltage and process, comprising:
   detecting when a main loop is in a harmonic lock problem state using a second loop;
   sending a signal to the main loop indicating that it is the harmonic lock problem state;
   adjusting a delay between each delay cell such that the main loop exits the harmonic lock problem state; wherein a VCO in the secondary loop is configured to run faster than a reference clock when the loop locks to the right reference clock phase.

14. The method of claim 13, wherein the VCO is configured to run approximately 1.4 times faster than the reference clock when the main loop is in a normal state.

15. A method for preventing a DLL from locking into the wrong phase and preventing a hang problem that is independent of temperature, voltage and process, comprising:
   detecting when a main loop is in a harmonic lock problem state using a second loop;
   sending a signal to the main loop indicating that it is the harmonic lock problem state;
   adjusting a delay between each delay cell such that the main loop exits the harmonic lock problem state; and
   interchanging parts between the main loop and the second loop.

16. An apparatus for preventing a DLL from locking into the harmonic phase and preventing a hang problem that is independent of temperature, voltage and process, comprising:

a means for detecting when a main loop is in a harmonic lock problem state using a second loop;

a means for sending a signal to the main loop from the second loop indicating that the main loop is in the harmonic lock problem state;

a means for adjusting a delay between each delay cell such that the main loop exits the harmonic lock problem state;

a means for determining a hang problem by determining a filter voltage; comparing the filter voltage to a reference voltage; and providing the main loop with a hang control signal based on the comparison; wherein the hang control signal is used for adjusting a first PFD an pulse forcing the main loon to go the direction that makes a VCDL run slower until the filter voltage comes within a target operating range.

* * * * *